US008344683B2

(12) United States Patent
Schulter et al.

(10) Patent No.: US 8,344,683 B2
(45) Date of Patent: Jan. 1, 2013

(54) APPARATUS FOR SENSORLESS POSITIONING WITH SIGNAL AMPLIFIER

(75) Inventors: Wolfgang Schulter, Meersburg (DE); Stefan Rau, Langenargen (DE); Helmut Weber, Ingolstadt (DE); Thomas Gründer, Ringwood East (AU); Carsten Sensche, Donauwörth (DE)

(73) Assignee: Conti Temic Microelectronic GmbH (DE)

( * ) Notice: Subject to any disclaimer, the term of this patent is extended or adjusted under 35 U.S.C. 154(b) by 263 days.

(21) Appl. No.: 12/666,041

(22) PCT Filed: Jun. 17, 2008

(86) PCT No.: PCT/DE2008/000983
§ 371 (c)(1),
(2), (4) Date: Jun. 11, 2010

(87) PCT Pub. No.: WO2009/000234
PCT Pub. Date: Dec. 31, 2008

(65) Prior Publication Data
US 2010/0244764 A1    Sep. 30, 2010

(30) Foreign Application Priority Data

Jun. 27, 2007 (DE) .......... 10 2007 030 149
Jun. 27, 2007 (DE) .......... 10 2007 030 150
Apr. 19, 2008 (DE) .......... 10 2008 019 821

(51) Int. Cl.
*H02P 6/08* (2006.01)
(52) U.S. Cl. ........ 318/721; 318/244; 318/245; 318/565; 318/615
(58) Field of Classification Search .......... 318/721, 318/244, 245, 565, 615
See application file for complete search history.

(56) References Cited

U.S. PATENT DOCUMENTS

| 4,684,858 | A | * | 8/1987 | Ma et al. ............... 388/820 |
| 5,012,166 | A | * | 4/1991 | Ushijima et al. ....... 318/400.13 |
| 6,144,179 | A | * | 11/2000 | Kessler et al. .......... 318/565 |
| 6,577,480 | B1 | | 6/2003 | Avery et al. |

(Continued)

FOREIGN PATENT DOCUMENTS
DE     101 24 615     12/2002
(Continued)

OTHER PUBLICATIONS
International Search Report dated Dec. 9, 2008.
(Continued)

*Primary Examiner* — Walter Benson
*Assistant Examiner* — David Luo
(74) *Attorney, Agent, or Firm* — RatnerPrestia

(57) ABSTRACT

A device and a method for determining the current position of a rotor, particularly the angle of rotation of the rotor, of an electric motor, wherein said device determines the current position of the rotor using the fluctuations of the armature current or the armature voltage of the electric motor. The fluctuations of the armature current or the armature voltage are separated from the fluctuations of the motor current or the motor voltage with the help of an amplifier unit dependent on a controllable offset value. The offset value is changed according to the motor current or the motor voltage. By virtue of the device and the method, the fluctuations of the armature current or the armature voltage can be separated from the fluctuations of the motor current or the motor voltage over the full measurement range of the motor current or the motor voltage.

12 Claims, 5 Drawing Sheets

U.S. PATENT DOCUMENTS

| | | |
|---|---|---|
| 6,845,337 B2 | 1/2005 | Gerlach |
| 2004/0222844 A1 | 11/2004 | Doorenbos et al. |
| 2009/0174354 A1 | 7/2009 | Knezevic et al. |

FOREIGN PATENT DOCUMENTS

| | | |
|---|---|---|
| EP | 0 349 328 | 1/1990 |
| EP | 1 659 683 | 5/2006 |
| WO | WO 2006/111144 | 10/2006 |

OTHER PUBLICATIONS

German Search Report dated Sep. 15, 2009.

\* cited by examiner

APPARATUS FOR SENSORLESS POSITIONING WITH SIGNAL AMPLIFIER

CROSS-REFERENCE TO RELATED APPLICATIONS

This application is the U.S. national phase application of PCT International Application No. PCT/DE2008/000983, filed Jun. 17, 2008, which claims priority to German Patent Application No. DE 10 2007 030 150.4, filed Jun. 27, 2007, German Patent Application No. DE 10 2007 030 149.0, filed Jun. 27, 2007, and German Patent Application No. DE 10 2008 019 821.8, filed Apr. 19, 2008, the contents of such applications being incorporated herein by reference.

FIELD OF THE INVENTION

The present invention relates to a device or a method for sensorless position determination.

DESCRIPTION OF RELATED ART

Hall sensors are frequently used to detect the relative position in order to position e.g. seats or window lifts in motor vehicles. Sensorless position detection (subsequently called SLP) renders such sensors unnecessary.

The patent document WO 2006/111144 describes a method for sensorless position determination of a rotor of a mechanically commutated DC motor and a method for sensorless determination of the rotation speed and the angle of rotation of a mechanically commutated DC motor, respectively.

The position of the rotor of the mechanically commutated electric motor or the rotational angle and speed of said electric motor are thereby determined on the basis of the commutation ripple (fluctuations) of the electric motor which is caused e.g. by the change of the armature inductance or the armature resistance. For this purpose, the current or voltage fluctuations caused by commutation are recorded and processed.

This requires filtering the small-amplitude current or voltage fluctuations caused by commutation from the other current and voltage fluctuations of large amplitudes, caused e.g. by fluctuations of the on-board power supply voltage or during the starting or braking phase or when the electric motor reaches the mechanical limit stop, and passing them on for further processing, e.g. for the analog-digital conversion, preferably in real time, i.e. without any time lag.

Both the current fluctuations caused by commutation and the other current fluctuations caused e.g. by fluctuations of the on-board power supply voltage or during the starting or braking phase or when the electric motor reaches the mechanical limit stop show very wide and partly overlapping frequency ranges. Moreover, the frequency ranges of the fluctuations keep changing all the time, depending on the operating state of the electric motor.

A frequency filter, for example a band pass filter, is not suitable to separate the current fluctuations caused by commutation from the other current fluctuations, which as a rule show a large value interval, because of the limited frequency range (pass range) of such filters.

SUMMARY OF THE INVENTION

An object of the present invention is to provide a device and a method of the kind mentioned in the opening paragraph, which allows the separation of current and voltage fluctuations of relatively small amplitudes caused by commutation from the other current and voltage fluctuations of relatively large amplitudes caused by fluctuations of the on-board power supply voltage and during the starting or braking phase or when the electric motor reaches the mechanical limit stop, with a short time lag and over the full measurement range of the motor current or the motor voltage.

A central idea of the invention is to separate the fluctuations of the armature current or the armature voltage caused by commutation from the fluctuations of the motor current or the motor voltage by means of an amplifier unit which depends on a controllable or variable offset value, wherein said offset value varies according to the motor current/voltage or the fluctuations of the motor current/voltage.

By means of the variable offset value, the offset range of the amplifier unit can also be adapted to the fluctuations of the motor current/voltage. This allows high amplification of the armature ripple current or the armature ripple voltage of the rotor over the full measurement range.

Since the current/voltage fluctuations are very large due to the fluctuations of the on-board power supply voltage and during the starting or braking phase or when the electric motor reaches the mechanical limit stop, the offset value has to be varied according to these current fluctuations also over a large range of values. For this purpose, the offset value has to be adapted to these current fluctuations with a time lag as short as possible.

According to aspects of the invention, the offset value is thus changed dependent on a control signal which is derived from the previously measured motor current or motor voltage values.

In a first embodiment, the control signal is iteratively derived from the previously measured motor current values and motor voltage values via random estimation processes, especially by means of a Kalman filter.

In a further embodiment, the control signal is derived from one or more currently measured values of the motor current/voltage fluctuations.

The offset value is then determined on the basis of the control signal. In a first embodiment, a plurality of digital intermediate signals is generated from the control signal with the help of a microcontroller or microprocessor. A downstream R2R network then changes these digital intermediate signals into an analog offset signal, i.e. an offset value. By setting one or more digital intermediate signals from zero to one according to the value of the control signal, the offset value can be changed according to the fluctuations of the motor current or the motor voltage. This has the advantage that due to the speed of the R2R network the offset value can be provided without any disruptive time lag. Moreover, thanks to the properties of the R2R network, the offset range can be extended in arbitrary resolution and without any loss of speed, just by addition of further R2R resistor groups.

In a further embodiment, a pulse-width modulated intermediate signal is generated from the control signal. The intermediate signal is then changed by a downstream low-pass filter into an offset signal, i.e. the offset value. By modifying the duty cycle of the pulse-width modulated intermediate signal according to the value of the control signal, the value of the offset value can be changed according to the fluctuations of the motor current or motor voltage.

BRIEF DESCRIPTION OF THE DRAWINGS

In the following, the device according to the invention will be explained on the basis of exemplary embodiments with the help of figures. Only components indispensable for the description of this invention are shown in the figures, in which.

DETAILED DESCRIPTION OF THE PREFERRED EMBODIMENTS

Figure 1:
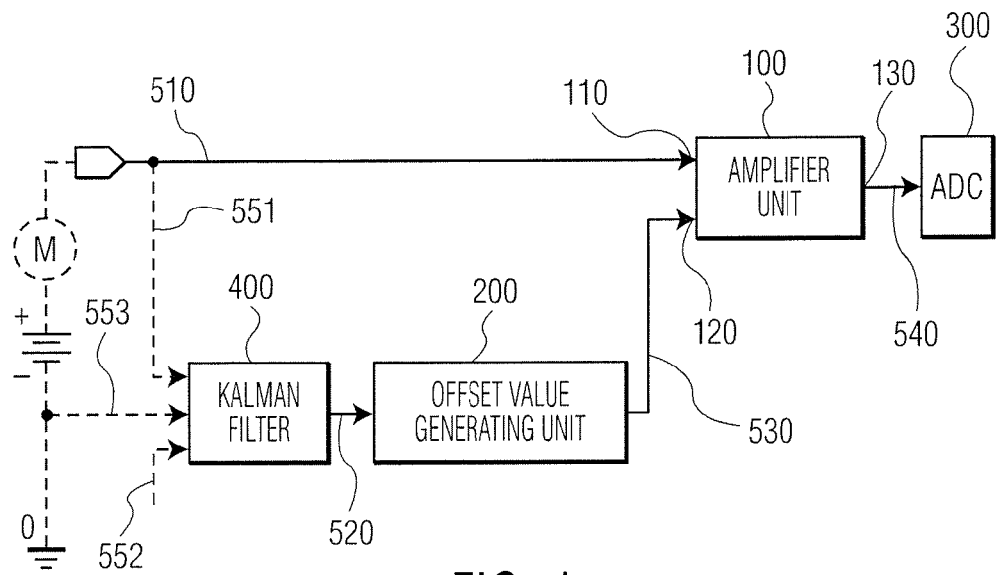
FIG. 1: is a block circuit diagram of the device according to the invention.

FIG. 1 shows a block circuit diagram of the device according to aspects of the invention. Accordingly, the device comprises an amplifier unit 100 and a unit 200 for the generation of a controllable offset value 530. In turn, the amplifier unit 100 comprises a measuring signal input 110 for the measuring signal 510, namely the motor voltage or the motor current from the rotor of the electric motor M, as well as an offset input 120 for the offset value 530, i.e. the offset or the offset voltage, as well as an output 130 for the amplified output signal 540, for example for a downstream analog-digital converter 300.

Figure 4:
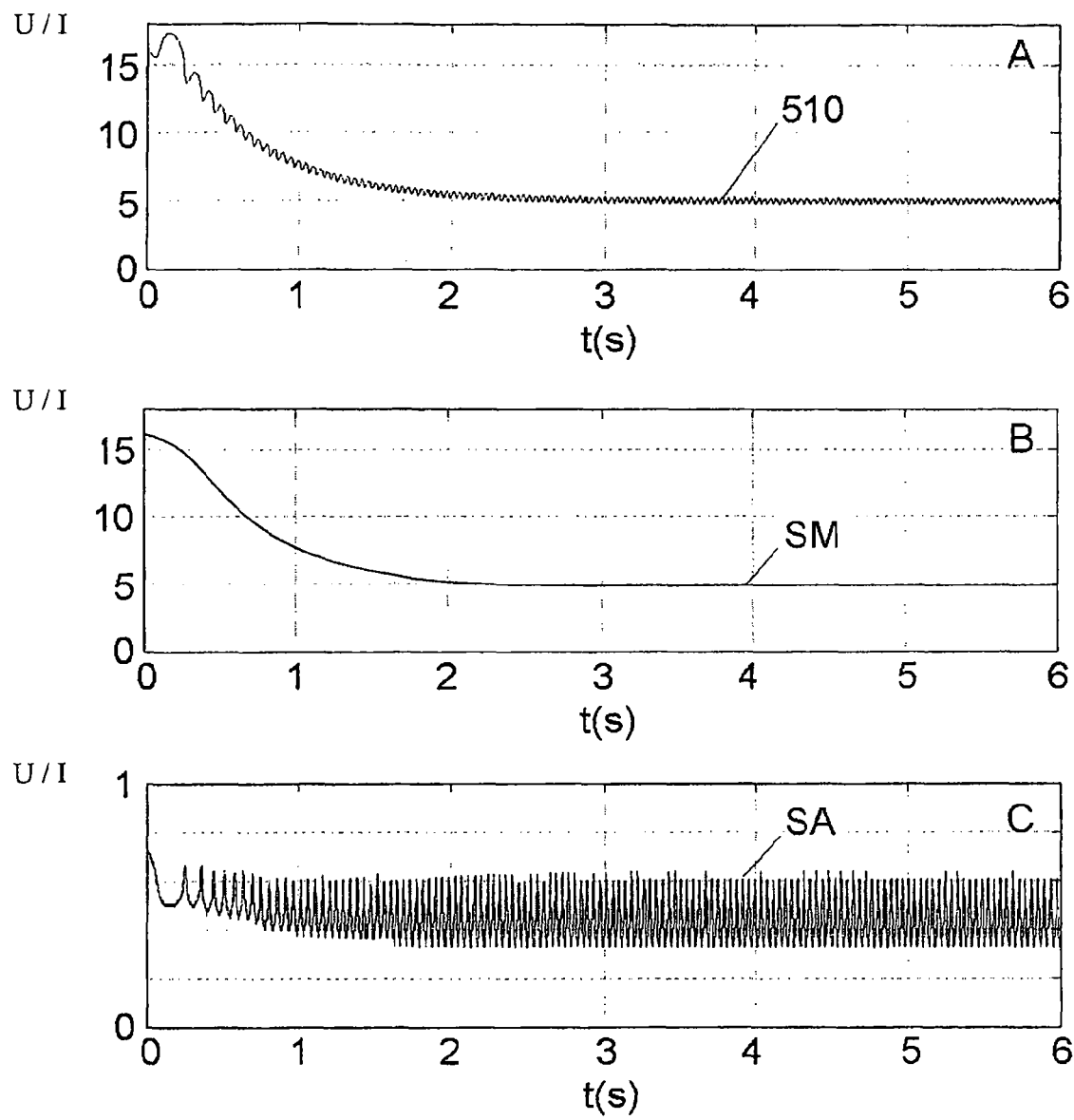
FIG. 4: is a graphic representation of the time course of the motor current (FIG. 4.A) and the armature current fluctuations SA caused by commutation of the motor (FIG. 4.B) as well as the motor current fluctuations caused by fluctuations during the starting phase SM (FIG. 4.C)

In addition to the current/voltage fluctuations of comparatively small amplitudes caused by the commutation of the motor M, the measuring signal 510 contains the fluctuations caused by the fluctuations SM of comparatively large amplitudes of the on-board power supply voltage or during the starting or braking phase or when the electric motor reaches the mechanical limit stop, as illustrated in FIG. 4.

The unit 200 generates the offset value 530 dependent on a control signal 520. The control signal 520 is iteratively derived preferably from the previously measured motor current or motor voltage values 551 with the help of a Kalman filter in unit 400 in a first exemplary embodiment. The control signal 520 can alternatively be determined from one or more currently measured values 551.

As an alternative, the control signal 520 can be derived from measurement values 552 for the fluctuations SM of the motor current or the motor voltage measured and stored immediately after the assembly of the device with the electric motor M at different operating states of the electric motor M. In order to measure the values 552, the electric motor M is operated under different operating conditions and with different operating currents and operating voltages which could occur during later operation. To this end, a measuring instrument not represented here in detail measures the fluctuations SM of the motor current or the motor voltage or the operating voltage or the operating current on the electric motor M and stores the measured values 552 with the respective operating voltage/current values and the operating states of the electric motor M accordingly in a storage unit also not represented here in detail of the device according to aspects of the invention.

Figure 5:
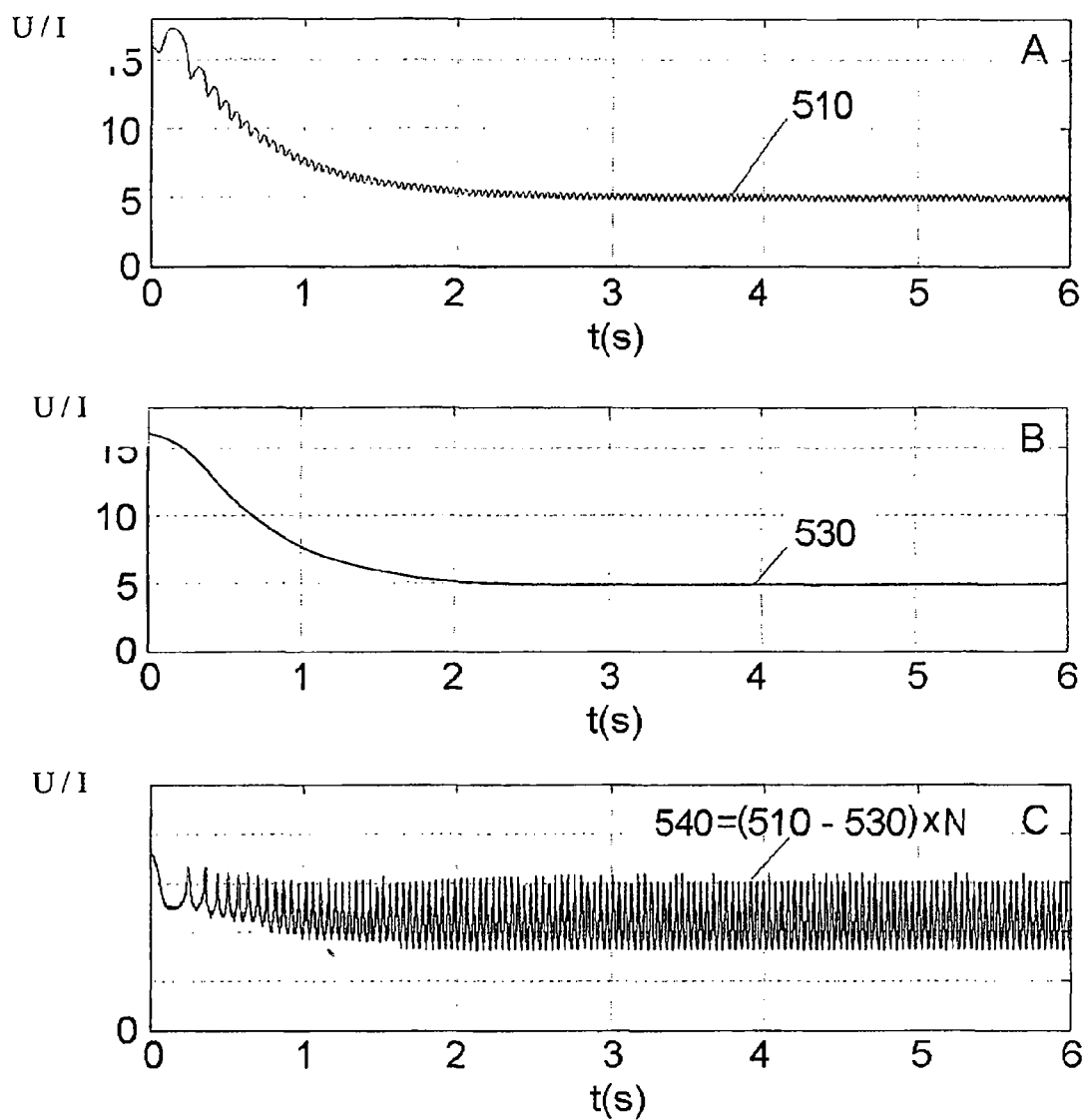
FIG. 5: is a graphic representation of the time course of the motor current or the motor voltage (FIG. 5.A) and the offset value (FIG. 5.B) as well as the output signal of the device according to the invention (FIG. 5.C)

The amplifier unit 100 is intended to separate the fluctuations SA from the fluctuations SM and subsequently amplify these SA. The amplifier unit 100 thereby subtracts the offset value 530 from the measured value 510. If the offset value 530 corresponds to the current amplitude of the fluctuations SM, only the current amplitude of the fluctuations SA will remain after subtracting, which corresponds to the armature voltage ripple, as illustrated in FIG. 5. These fluctuations SA are then amplified by the amplifier unit 100 and passed on to the downstream unit 300, e.g. an analog-digital converter, for further processing. The amplifier unit 100 preferably is an operational amplifier 101.

Figure 2:
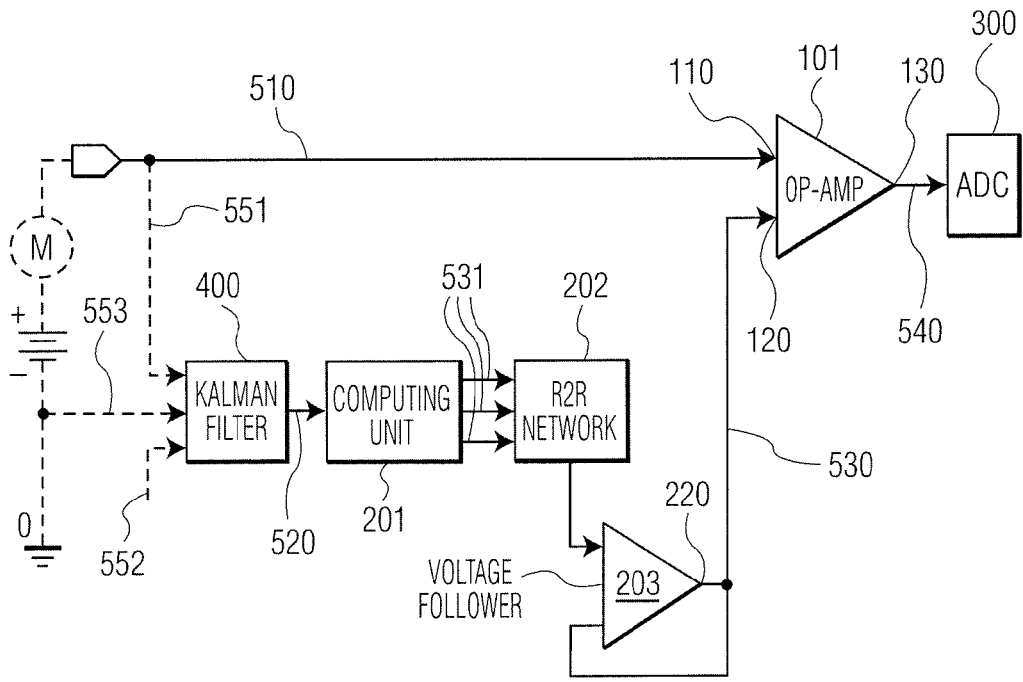
FIG. 2: is a block circuit diagram of a first exemplary embodiment of the device according to aspects of the invention.

FIG. 2 shows a first exemplary embodiment of the device according to aspects of the invention. Accordingly, the unit 200 shows a computing unit 201, e.g. a micro controller or microprocessor and an R2R network 202 as well as a voltage follower circuit 203, a feedback operational amplifier. The computing unit 201 calculates a plurality, e.g. three, of digital output signals 531, using the control signal 520. The R2R network 202 changes these digital output signals 531 into an analog offset value 530. Out of three digital output signals 531 $2^3=8$ different offset values 530 can be determined and, therefore, also eight offset ranges can be set. Depending on the requirements, it is possible to set only two, four or more than eight, e.g. sixteen, offset values 530 or offset ranges here. To this end it suffices to set a suitable number of digital output signals 531 for the R2R network 202 with a corresponding number of R2R resistor groups.

As an alternative to the computing unit 201 and the R2R network 202 also an internal processor with an integrated digital-to-analog converter can be used for generating the offset value 530. In this case, the analog output of the converter or processor is connected to the input of the voltage follower circuit 203.

The voltage follower circuit 203 serves to decouple the R2R network 202 from the operational amplifier 101.

Figure 3:
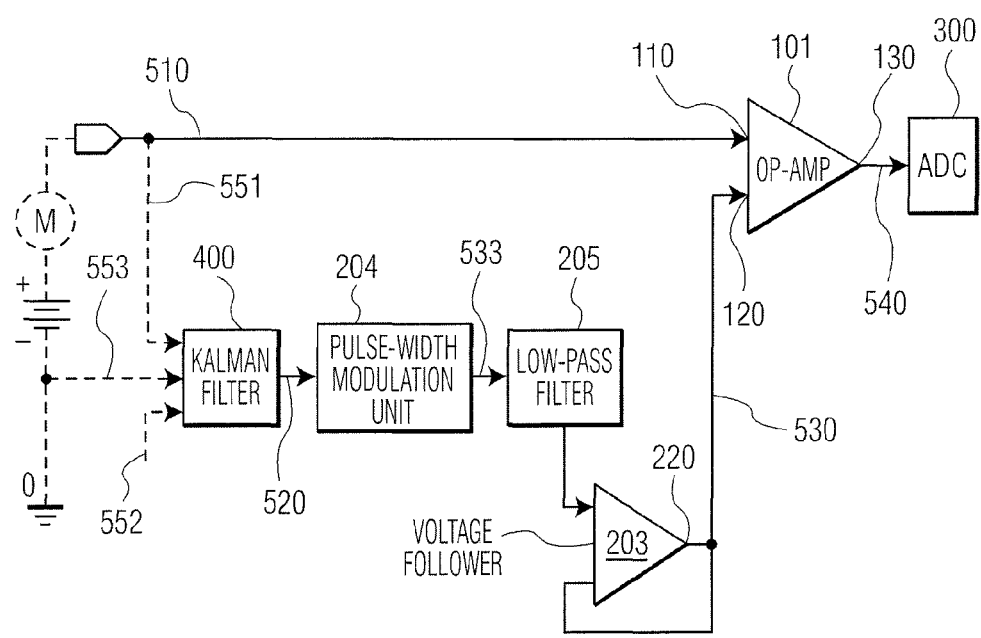
FIG. 3: is a block circuit diagram of a second exemplary embodiment of the device according to aspects of the invention.

FIG. 3 shows a second exemplary embodiment of the device according to aspects of the invention. Accordingly, the unit 200 comprises a pulse-width modulation unit 204 and a low-pass filter 205, besides the voltage follower circuit 203, for providing the offset value 530. The pulse-width modulation unit 204 generates a pulse-width modulated output signal 533 from the control signal 520. The downstream low-pass filter 205 then changes this PWM signal 533 into an analog offset value 530. The offset value 530 can be steplessly varied using the duty cycle of the PWM signal 533 and subsequent low-pass filtering. Consequently, the offset range of the operational amplifier 101 is also steplessly adjustable.

Similarly to the first exemplary embodiment, the voltage follower circuit 203 serves to decouple the low-pass filter 205 from the operational amplifier 101.

FIG. 5 is a graphic representation, which shows the time course of the motor current (FIG. 4.A), the offset value (FIG. 4.B) and the output signal of the device (FIG. 4.C) as well as the functional principle of the device according to aspects of the invention.

The amplifier unit 100 subtracts the offset value 530 from the motor voltage 510. The offset value 530 is derived from the motor voltage 510 iteratively and corresponds to the motor voltage fluctuations SM. Consequently, only the armature voltage fluctuations SA remain after subtracting. These armature voltage fluctuations SA are then multiplied by the amplification factor N of the amplifier unit. The result is passed on to the analog-digital converter 300 as an output signal 540 for further processing.

Figure 6:
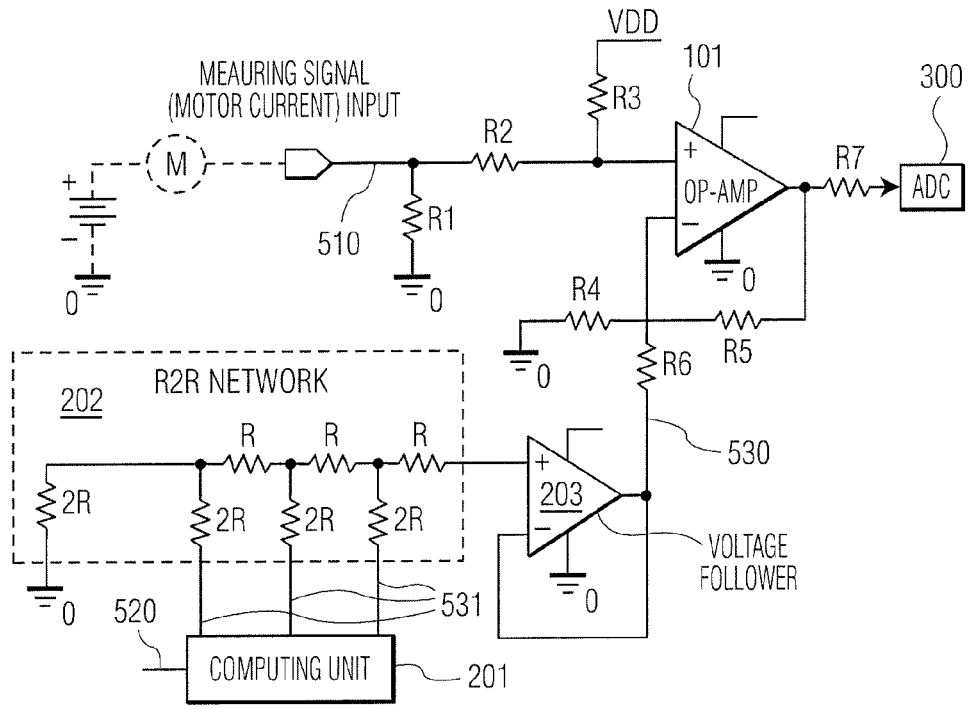
FIG. 6: is a circuit diagram of the first exemplary embodiment of the device according to aspects of the invention.
Figure 7:
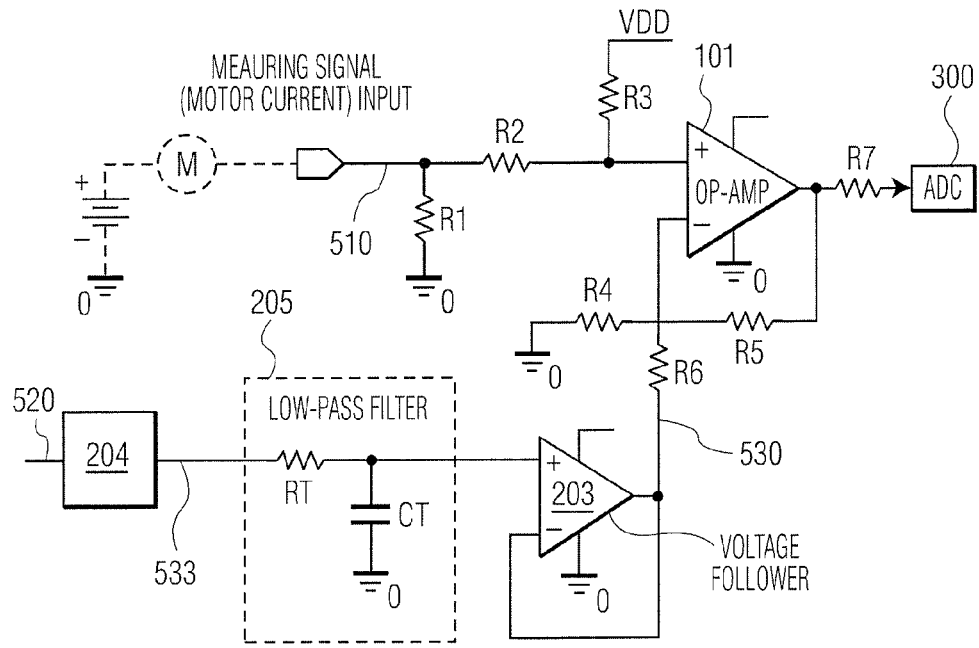
FIG. 7: is a circuit diagram of the second exemplary embodiment of the device according to aspects of the invention.

FIGS. 6 and 7 show realizations of the circuitry of the device shown in FIGS. 2 and 3, respectively. The resistor R1 in the two FIGS. 6 and 7 is a measuring shunt, which serves to measure the motor current 510. The two resistors R2 and R3 cause an input voltage increase (pull up) for the operational amplifier 101, so that said amplifier 101 is working within the operating range even without any motor current, i.e. when the motor current equals zero amperes. The resistances R4, R5 and R6 serve to set the offset value 530 as well as to amplify it. The resistance R7 protects the input of the analog-digital converter 300 from overloading in case of a fault (overload, short circuit or the like) of the motor. Instead of the resistor R7, a Zener diode or a capacitor can be used for voltage stabilization. As an alternative protective measure the operational amplifier 101 can be supplied with operating voltage controlled by a microcontroller.

The R2R network 202 in FIG. 6 consists of three R-2R resistor groups. Said R2R network 202 allows generating $2^3=8$ different offset values 530.

The resistor RT and the capacitor CT in FIG. 7 form an RC low-pass filter, which generates a direct voltage, namely the analog offset value 530, from the PWM signal 533, which is generated by the pulse-width modulation unit 204.

Instead of the operational amplifier 203 as voltage follower circuit, a transistor emitter follower circuit can also be used here.

The circuitries according to the invention realize a current measuring amplifier of relatively high gain and, at the same time, with a high dynamic range.

This device according to aspects of the invention allows high small-signal amplification over the full current measurement range without elaborate change of amplification. The signal generating unit for the offset signal can be integrated into any signal amplifier circuit already existing. Using this device does not require any hardware modifications for the purpose of adaptation to new motor types.

A particularly distinguishing feature of the device according to aspects of the invention is that the small-amplitude current fluctuations caused by commutation can be better sensed in the presence of high motor currents, as occurring e.g. when the electric motor reaches the mechanical limit stop, and changed by an analog-to-digital converter into a digital signal with a lesser quantization error.

The invention claimed is:

1. A device for determining a current position of a rotor of an electric motor,
   wherein said device determines the current position of the rotor using fluctuations of an armature current or an armature voltage of the electric motor,
   wherein
   said device separates the fluctuations of the armature current or the armature voltage from fluctuations of motor current or motor voltage by aid of an amplifier unit that is dependent on a controllable offset value,
   wherein the device changes the offset value according to the motor current or the motor voltage or the fluctuations of the motor current or the motor voltage,
   wherein the device changes the offset value dependent on a control signal, and
   wherein the device derives said control signal from previously measured motor current or motor voltage values.

2. A device according to claim 1, wherein the device derives the control signal from the previously measured motor current or motor voltage values iteratively by aid of stochastic estimation procedures.

3. A device according to claim 1, wherein the device derives the control signal from the previously measured motor current or motor voltage values iteratively by aid of a Kalman filter.

4. A device according to claim 1, wherein the device derives the control signal from one or more currently obtained measurements of the fluctuations of the motor current or the motor voltage.

5. A device according to claim 1, wherein the device derives the control signal from measurements of the fluctuations of the motor current or the motor voltage obtained and stored immediately after assembly of the device with the electric motor at different operating states of the electric motor.

6. A device according to claim 5, wherein the operating states of the electric motor include: electric motor starts, electric motor acceleration, electric motor braking, or when the electric motor reaches a mechanical limit stop.

7. A device according to claim 1, wherein said device derives a plurality of digital signals from the control signal and generates the offset value from said plurality of digital signals by aid of an R/2R network.

8. A device according to claim 1, wherein said device generates a pulse-width modulated intermediate signal from the control signal by aid of pulse-width modulation and generates the offset value from the intermediate signal.

9. A device according to claim 8, wherein said device generates the offset value from the pulse-width modulated intermediate signal using a low-pass filter.

10. A device according to claim 1, wherein the current position of the rotor is an angle of rotation of the rotor.

11. A method for determining a current position of a rotor of an electric motor comprising the steps of:
    determining the current position of the rotor using fluctuations of an armature current or an armature voltage of the electric motor,
    separating the fluctuations of the armature current or the armature voltage from fluctuations of motor current or motor voltage by an amplifier unit that is dependent on a controllable offset value,
    changing the offset value according to the motor current or the motor voltage or the fluctuations of the motor current or the motor voltage,
    changing the offset value dependent on a control signal, and
    deriving said control signal from previously measured motor current or motor voltage values.

12. The method according to claim 11, wherein the current position of the rotor is an angle of rotation of the rotor.

* * * * *